United States Patent
Kossives et al.

[11] Patent Number: 6,160,721
[45] Date of Patent: Dec. 12, 2000

[54] MICROMAGNETIC DEVICE FOR POWER PROCESSING APPLICATIONS AND METHOD OF MANUFACTURE THEREFOR

[75] Inventors: Dean P. Kossives, Glen Gardner, N.J.; Ashraf W. Lotfi, Rowlett, Tex.; Lynn F. Schneemeyer, Westfield, N.J.; Michael L. Steigerwald, Martinsville, N.J.; R. Bruce Van Dover, Maplewood, N.J.

[73] Assignee: Lucent Technologies Inc., Murray Hill, N.J.

[21] Appl. No.: 09/490,655

[22] Filed: Jan. 24, 2000

Related U.S. Application Data

[62] Division of application No. 08/872,250, Jun. 10, 1997.

[51] Int. Cl.[7] ........................................... H02M 3/35
[52] U.S. Cl. ................................................. 363/21
[58] Field of Search ................................. 363/15, 16, 20, 363/21, 97, 131, 144, 147; 29/592.1, 602.1; 333/24.1

[56] References Cited

U.S. PATENT DOCUMENTS

| 5,787,568 | 8/1998 | Lotfi et al. ............................. 29/602.1 |
| 5,939,641 | 8/1999 | Lotfi et al. ................................ 73/768 |
| 5,952,909 | 9/1999 | Umeno et al. .......................... 336/192 |
| 6,055,179 | 4/2000 | Koganei et al. ........................ 365/158 |

*Primary Examiner*—Matthew Nguyen

[57] ABSTRACT

The present invention provides a power micromagnetic integrated circuit having a ferromagnetic core, a method of manufacture therefor and a power processing circuit employing the same, that includes: (1) a substrate; (2) an insulator coupled to the substrate and (3) a metallic adhesive that forms a bond between the insulator and the ferromagnetic core to secure the ferromagnetic core to the substrate.

20 Claims, 5 Drawing Sheets

MICROMAGNETIC DEVICE FOR POWER PROCESSING APPLICATIONS AND METHOD OF MANUFACTURE THEREFOR

This application is a divisional of application Ser. No. 08/872,250 filed Jun. 10, 1997, currently pending. The above-listed application Ser. No. 08/872,250 is commonly assigned with the present invention and is incorporated herein by reference.

TECHNICAL FIELD OF THE INVENTION

The present invention is directed, in general, to micromagnetic devices and, more specifically, to a micromagnetic device for power processing applications, a method of manufacture therefor and a power processing circuit employing the same.

BACKGROUND OF THE INVENTION

A magnetic device includes a magnetic core coupled to conductor windings such that the magnetic flux flows in a closed path about the core. Magnetic devices are generally configured in an EE-type arrangement or a toroidal geometry. In the EE-type magnetic device, a first and second core-portion of the magnetic core surround the conductor windings. In the toroidal magnetic device, a first and second winding-portion of the conductor windings surround the magnetic core.

Micromagnetic devices (e.g., microinductors or microtransformers) are micron-scaled integrated circuit magnetic devices; the electromagnetic properties of the device are provided by the presence of the magnetic core and conductor windings. In the past, micromagnetic devices were only applicable to low-level signal applications (e.g., recording heads). With the advancement in the production techniques for integrated circuits, it is now possible to fabricate micromagnetic devices for relatively large signal and power processing applications. For instance, micromagnetic devices may be employed in power systems for wireless communications equipment.

While many power semiconductor devices (having ferrite cores, for instance) have been scaled down into integrated circuits, inductive elements at the present time remain discrete and physically large. Of course, there is a strong desire to miniaturize these inductive components as well. By extending thin-film processing techniques employed in power semiconductor devices to ferromagnetic materials, the size of the conventional discrete ferromagnetic-core inductive devices can be reduced significantly. Ferromagnetic materials such as alloys, however, have much higher saturation flux densities than ferrites (e.g., 10–20 kG verses 3 kG) thereby reducing the physical volume of the core for a given inductance and energy requirement. To limit the eddy current losses in the ferromagnetic materials, the materials must be fabricated in inordinately thin films. Processing thin-film ferromagnetic materials with traditional rolling and tape winding techniques proves to be very costly as the desired tape thicknesses drops below 0.001 inches (i.e., 25 $\mu$m). It is thus advantageous to produce such thin films by other integrated circuit deposition techniques such as sputtering or electroplating.

Another germane consideration associated with manufacturing micromagnetic devices is securing the ferromagnetic material to a silicon substrate or the like. More specifically, forming an adequate bond between the ferromagnetic material and an insulator coupled to the substrate is an important consideration. Many factors such as oxide formation, melting point temperature, interposed contamination, affinity between materials and mechanical stress at the interface, influence the adhesion of a thin film to a substrate. For instance, one technique readily employed in thin film manufacturing processes is the formation of an oxide-metal bond at the interface between the substrate and the film. The oxide-metal bond may be formed by employing an oxygen-active metal (such as tungsten or chromium) on an oxygen-bearing substrate (such as glass or ceramic) in conjunction with a refractory metal (such as tantalum or tungsten). With regard to contaminants, it is advantageous to remove any impurities interposed on the substrate. Cleaning methods vary in effectiveness and the selected method required depends on the ability of the deposition process to dislodge contaminant atoms. As an example, different cleaning techniques may be employed with sputtering or electroplating.

Of course, the ultimate consideration with regard to the adhesion properties depends on the materials employed. While others have attempted to address the adhesion of ferromagnetic materials to an insulator coupled to a substrate [e.g., *Measured Performance of a High-Power-Density Microfabricated Transformer in a DC-DC Converter*, by Charles R. Sullivan and Seth R. Sanders, IEEE Power Electronics Specialists Conference, p. 287–294 (July 1996), which is incorporated herein by reference], to date, the problem remains unresolved. Developing an adhesive material that simultaneously forms a bond with the insulator and the ferromagnetic material such that thin-film processing can be applied to inductive elements will provide a foundation for the introduction of power micromagnetic integrated circuits.

Accordingly, what is needed in the art is an adhesive for a micromagnetic device that can secure a ferromagnetic core to an insulator coupled to a substrate such that the micromagnetic device can handle the more stringent requirements associated with power processing applications.

SUMMARY OF THE INVENTION

To address the above-discussed deficiencies of the prior art, the present invention provides, in one aspect, for use with a power micromagnetic device having of a ferromagnetic core and formed on a substrate having an insulator coupled thereto, an adhesive including a metallic material that forms a bond between the insulator and the ferromagnetic core to secure the power micromagnetic device to the insulator. The present invention also provides a method for securing the ferromagnetic core of the power micromagnetic device to the insulator coupled to the substrate employing the metallic adhesive.

In related aspects, the present invention provides a power micromagnetic integrated circuit having a ferromagnetic core, a method of manufacture therefor and a power processing circuit employing the same, that includes: (1) a substrate; (2) an insulator coupled to the substrate and (3) a metallic adhesive that forms a bond between the insulator and the ferromagnetic core to secure the ferromagnetic core to the substrate.

The present invention introduces the broad concept of employing a metallic adhesive to secure a ferromagnetic core to an insulator coupled to a substrate. As a result, the limitation associated with depositing a thin-film ferromagnetic material on an insulator coupled to a silicon substrate (or the like) is resolved. The bond formed between the ferromagnetic material and insulator may be substantially physical, substantially chemical or a combination thereof. The present invention, therefore, provides the foundation for a micromagnetic device that can handle the requirements associated with power processing applications. For the purposes of the present invention, the metallic adhesive is an inorganic-based material that is substantially free of titanium.

The foregoing has outlined, rather broadly, features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
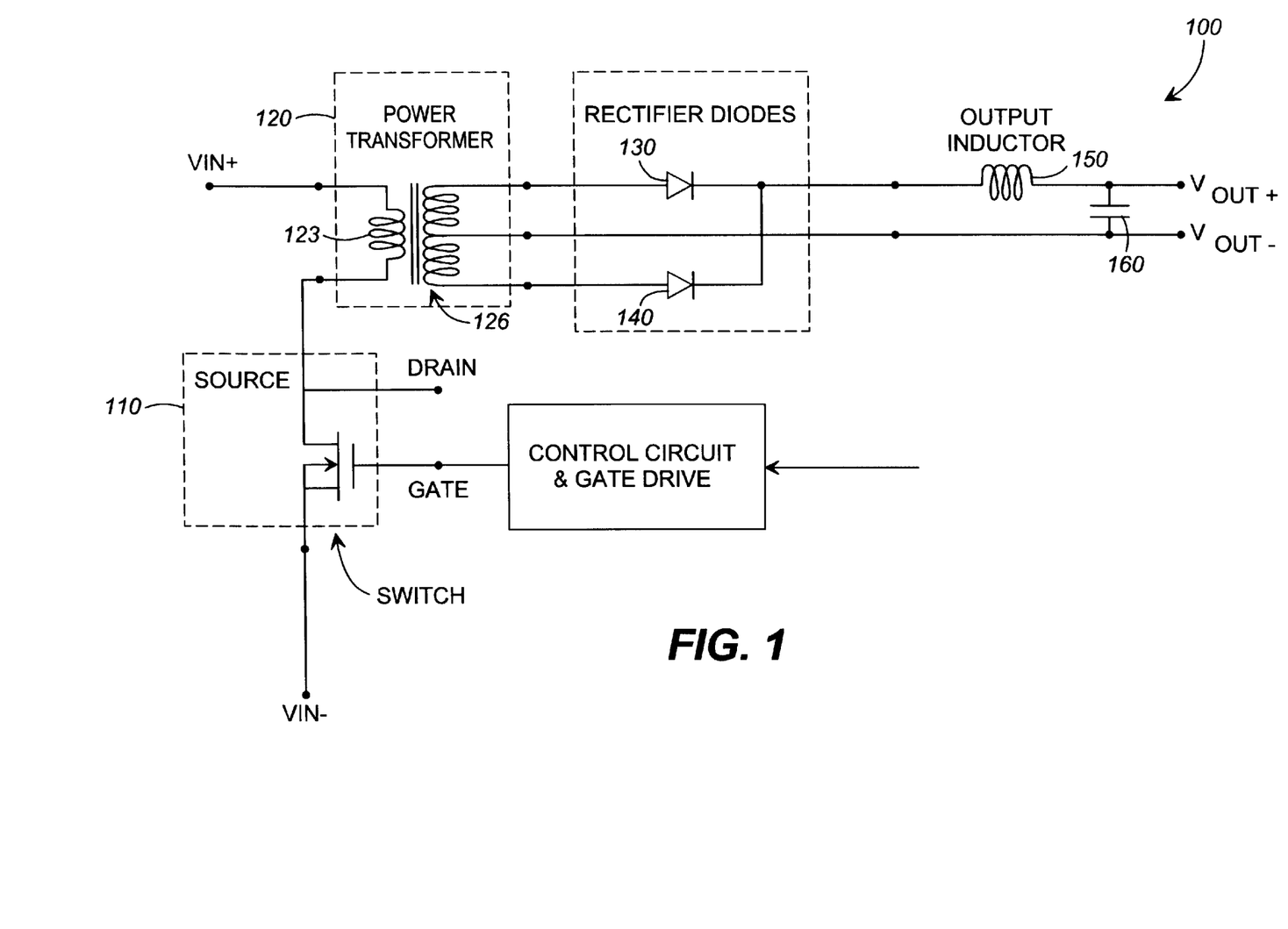
FIG. 1 illustrates a schematic diagram of an embodiment of a power processing circuit constructed according to the principles of the present invention.

Referring initially to FIG. 1, illustrated is a schematic diagram of an embodiment of a power processing circuit 100 constructed according to the principles of the present invention. The power processing circuit 100 includes a power train having a conversion stage including a switching circuit 110 for receiving input electrical power $V_{IN}$ and producing therefrom switched electrical power. The power processing circuit 100 further includes a filter circuit (including an output inductor 150 and output capacitor 160) for filtering the switched electrical power to produce output electrical power (represented as a voltage $V_{OUT}$) The power processing circuit 100 still further includes a power micromagnetic integrated circuit (e.g., transformer) 120, having a primary winding 123 and a secondary winding 126, and a rectifier (including rectifying diodes 130, 140) coupled between the power conversion stage and the filter stage. The transformer 120 is constructed according to the principles of the present invention as hereinafter described. The transformer 120 and power processing circuit 100 are submitted for illustrative purposes only and other power micromagnetic integrated circuits and applications therefor are well within the broad scope of the present invention.

Figure 2:
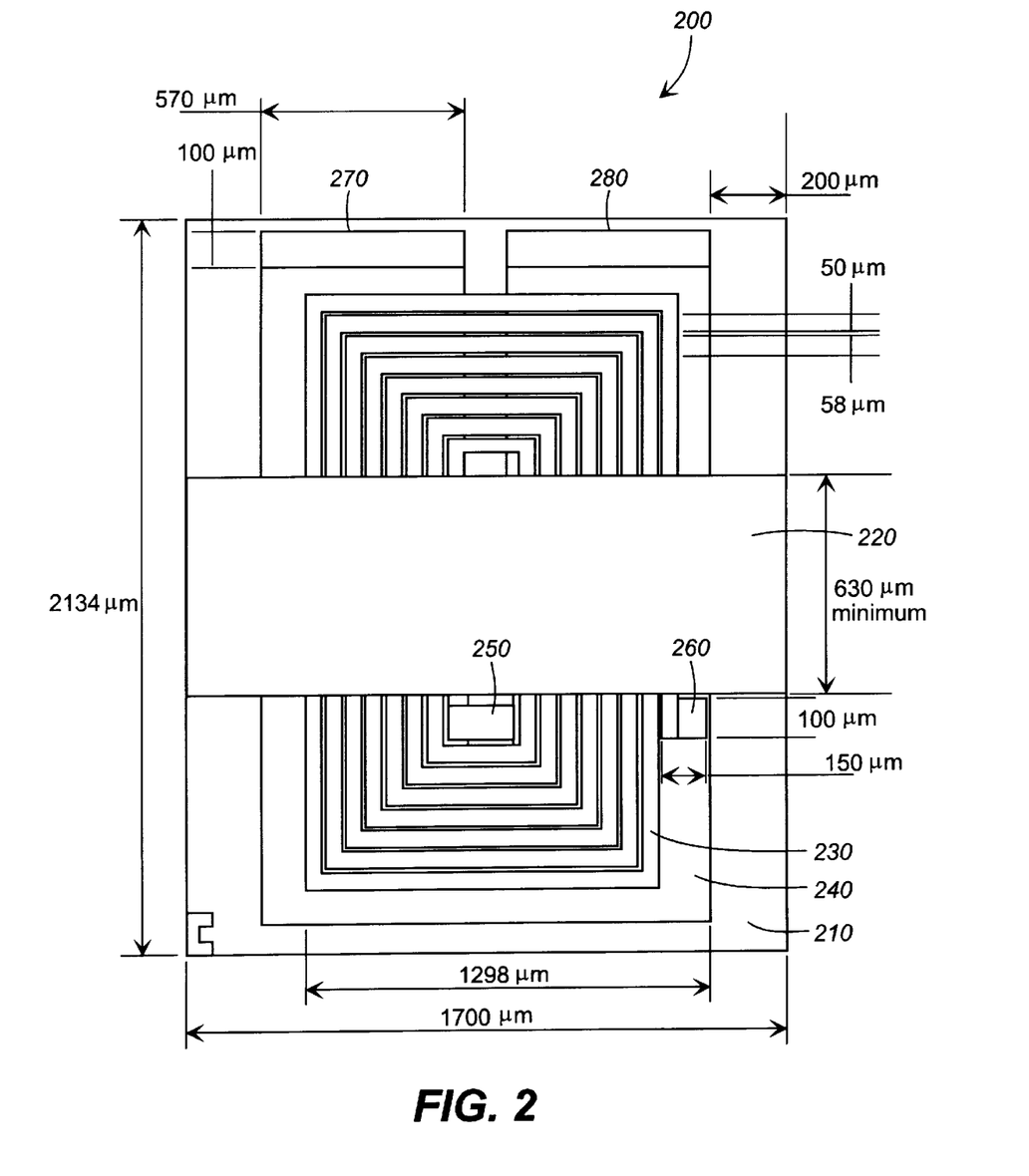
FIG. 2 illustrates a top view of an embodiment of a power micromagnetic device constructed according to the principles of the present invention.

Turning now to FIG. 2, illustrated is a top view of an embodiment of a power micromagnetic device 200 constructed according to the principles of the present invention. The power micromagnetic device 200 is an EE-type transformer device. The power micromagnetic device 200 includes a ferromagnetic core having a first core-portion 210 and a second core-portion 220. While the ferromagnetic core may be composed of an alloy [e.g., a permalloy™ composed of nickel—iron including about 80% nickel and 20% iron), other ferromagnetic materials are well within the broad scope of the present invention. The power micromagnetic device 200 also includes conductive windings having a primary winding 230 and a secondary winding 240. Of course, the windings may be formed from any conductive material. The primary winding 230 terminates in a plurality of terminals 250, 260; the secondary winding 240 terminates in a plurality of terminals 270, 280.

The first and second core-portions 210, 220 surround the primary and secondary windings 230, 240. The magnetic flux of the power micromagnetic device 200 predominantly flows along the width of the ferromagnetic core. As a result, the ferromagnetic core is anisotropic thereby controlling hysteresis losses at higher frequencies (e.g., above 10 MHZ). The anisotropic property may be introduced by a deposition process in a uniform magnetic field through an energized solenoid or permanent magnet at levels of 10–500 Oersteds [("Oe"); 8000–40000 A/m]. The induced anisotropy also produces a hard and easy axis, along which the permeability is a minimum and maximum. In some cases, the permeability is increased five-fold from the hard axis to the easy axis as a result of the anistropy. The EE-type structure effectively controls the permeability of the ferromagnetic core by regulating the direction of the induced anisotropy with respect to the magnetic field vector. The first and second core-portion 230, 240 are coupled together by magnetic vias (when anisotropic characteristics and control are desired) or remain separate (when an air gap is desired).

With regard to the ferromagnetic material, the total thickness thereof is selected based on the inductance requirements of the device. For operation at relatively high frequencies (e.g., above 10 MHZ), eddy currents induced in the ferromagnetic materials can become problematic due to the resulting low resistivity (e.g., $\rho \sim 20–100\ \mu\Omega cm$). To reduce the eddy currents, the magnetic film thickness of the ferromagnetic material should be limited to a fraction of the skin depth $\delta$ [where $\delta=(\rho/\pi f\mu)^{1/2}$ for a given frequency f of operation]. For instance, at 8 MHZ and $\mu=1000$, the skin depth is about 2.5 $\mu$m; thus, to limit the effect of the eddy currents the film thickness should be below about 2 $\mu$m (obviously, thinner films are necessary as the permeability increases). When the inductance specification requires a larger thickness, insulated multiple layers of film (with each layer not exceeding the necessary skin thickness) should be employed.

Figure 3:
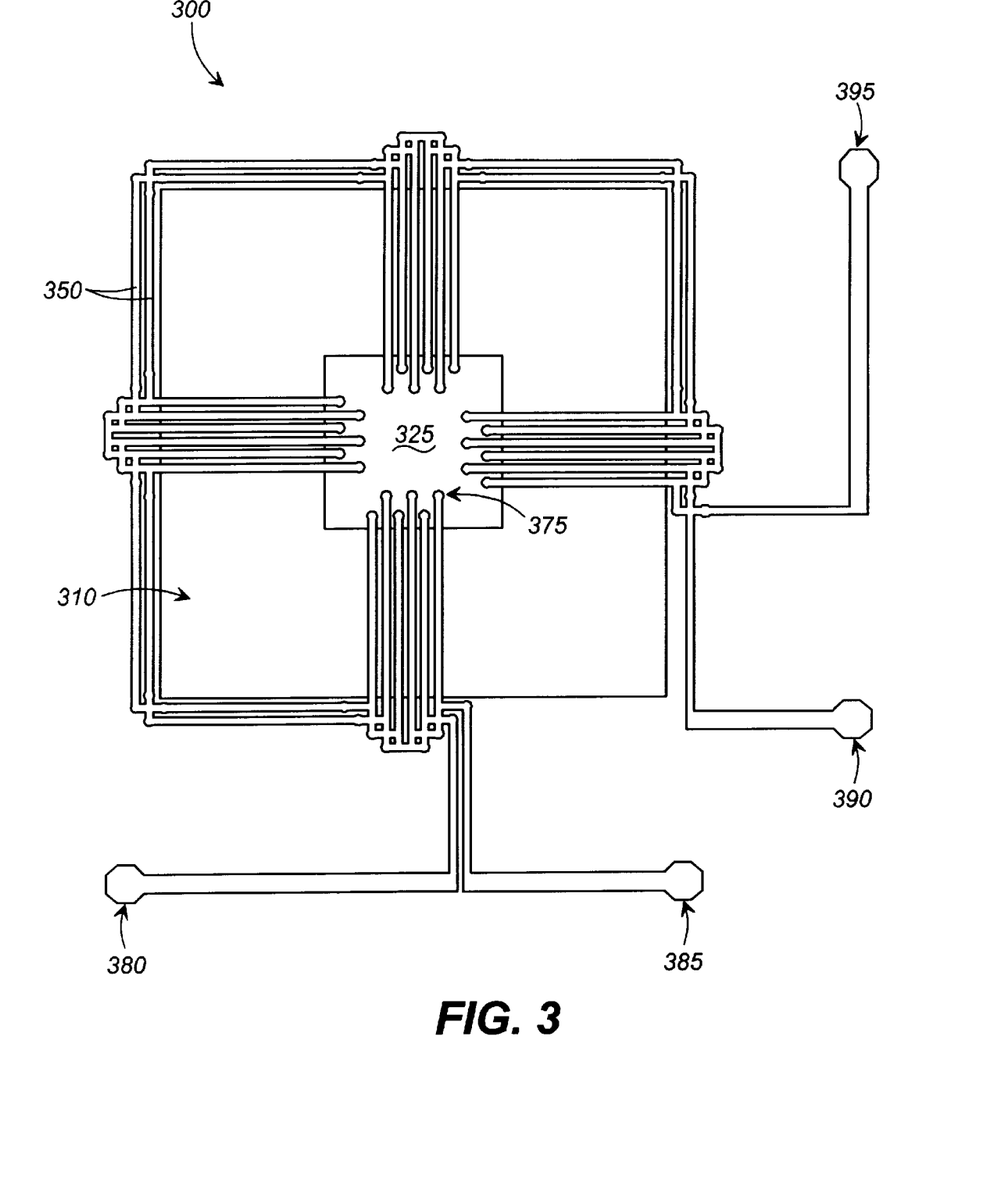
FIG. 3 illustrates a top view of another embodiment of a power micromagnetic device constructed according to the principles of the present invention.

Turning now to FIG. 3, illustrated is a top view of another embodiment of a power micromagnetic device 300 constructed according to the principles of the present invention. The power micromagnetic device 300 is a toroidal transformer device. The power micromagnetic device 300 includes a ferromagnetic core 310 (proximate a window 325) and conductive windings (collectively designated 350) that surround the ferromagnetic core 310 through inner-layer connection vias (one of which as designated 375) and terminate in a plurality of terminals 380, 385, 390, 395. The inner-layer connection vias 375 lie within the window 310. The line space rules and distance between via requirements determine the size of the window 310. Obviously, with the trend moving toward smaller devices, a smaller window dimension is desirable. The dimension of the window 310, however, is limited as dictated by the thickness of the ferromagnetic material necessary to achieve the inductance characteristics. The inductance, as an example, for a toroidal device is maximized if the toroid is generally circular; the inductance is less if the toroid is formed into a square (~25% less) and finally degrades as the square is elongated into a rectangle. The inductance for a square toroid having a core width to meet a minimum window dimension, is:

$$L=\mu_0[N^2t]/4(1+\pi)$$

where N is the number of turns of the winding and t is the thickness of the film. The size of the window 310 is determined by the minimum via size, via-via clearance and the number of vias (related to the number of primary and secondary turns). Therefore, to reduce the die size of the device, a larger core thicknesses is necessary to obtain an equivalent inductance to an EE ferromagnetic core of equal winding turns and core width.

Remember that for the EE-type structure fewer winding connection vias are required thereby reducing the amount of die space necessary to couple the windings to the core. Toroidal transformers, however, offer a relatively flat and smooth surface for the deposition of the ferromagnetic material thereby reducing the formation of stresses that may cause the degradation of the magnetic properties of the film deposited thereon. This is especially important when the ferromagnetic material has a high magnetostriction constant. The EE-type structure, also, requires special provisions to create a continuous magnetic path from the first core-portion to the second core-portion. This is accomplished by introducing vias within the central core region and at the two outer core edges. The vias provide connectivity for the ferromagnetic material such that the first and second core-portions are coupled together continuously. The vias, however, are a source of stress concentration that require additional slope reduction to decrease the accumulated stresses.

While the preceding FIGUREs illustrate both the EE-type and toroidal transformer device (including the advantages and disadvantages therefor), other power micromagnetic devices (including variations of the foregoing devices) and applications therefor are well within the broad scope of the present invention.

Figure 4:
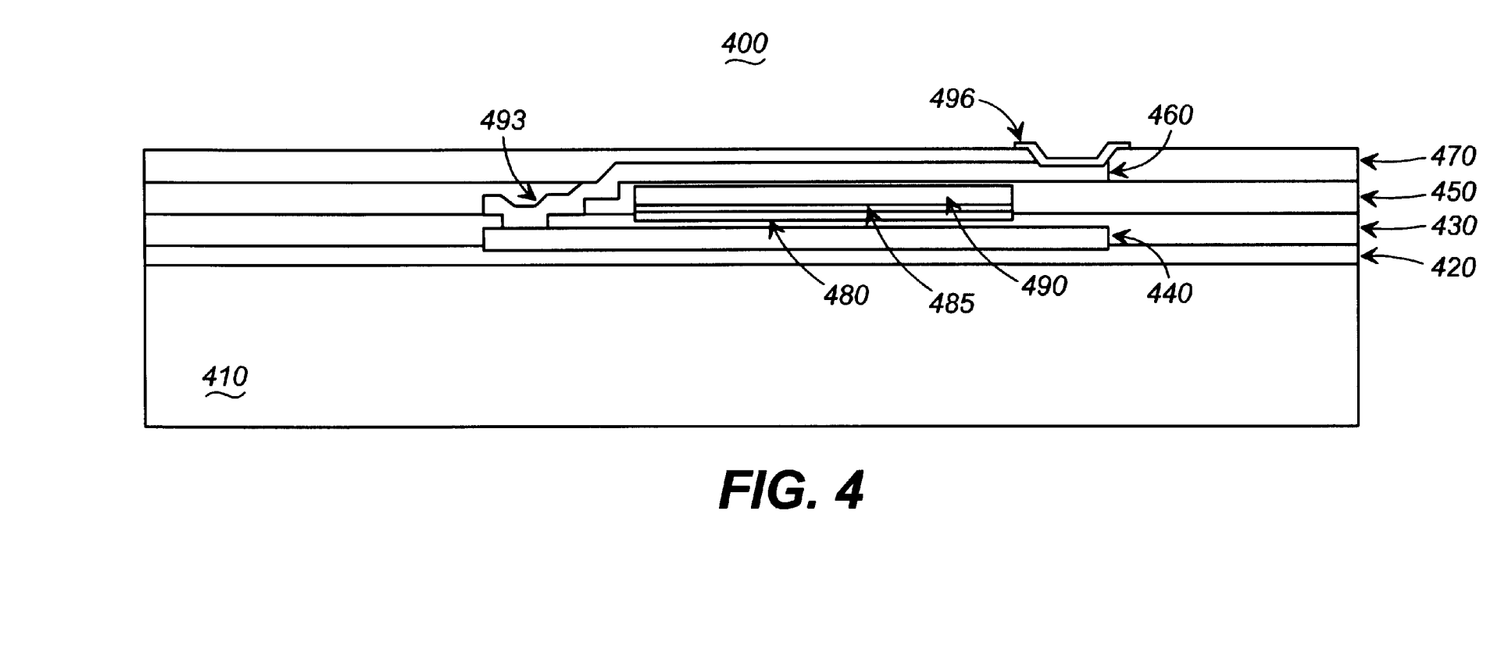
FIG. 4 illustrates a cross-sectional view of an embodiment of a power micromagnetic integrated circuit ("PMIC") constructed according to the principles of the present invention.

Turning now to FIG. 4, illustrated is a cross-sectional view of an embodiment of a power micromagnetic integrated circuit ("PMIC") 400 constructed according to the principles of the present invention. The PMIC 400 includes a substrate (composed of, for instance, silicon, glass, ceramic or the like) 410 having a passivation layer (e.g., silicon-dioxide) 420 formed thereon using conventional formation processes such as a thermal growing process. The PMIC 400 further includes a first and second conductive winding layer (composed of, for instance, aluminum or any other conductive material) 440, 460 surrounded by first, second and third insulative layers or insulators 430, 450, 470. The PMIC 400 still further includes a metallic adhesive that contains a first adhesive layer (e.g., chromium) 480 and a second adhesive layer (e.g., silver) 485. The PMIC 400 still further includes a ferromagnetic core 490. The PMIC 400 still further includes a plurality of inner-layer vias (collectively designated 493) that provide multiple paths between layers of the PMIC 400 and a terminal 496 for connection to another device. The passivation layer 420 and first, second and third insulative layers 430, 450, 470 may be formed from an inorganic composition (e.g., silicon-dioxide, aluminum-dioxide, beryllium-dioxide), an organic polymer (e.g., a polyimide) or any other insulating material. As previously mentioned, the metallic adhesive is an inorganic-based material that is substantially (about 70%) free of titanium. While the first adhesive layer 480 generally contains materials selected from Group 4 elements (such as zirconium and hafnium; excluding about a 70% or more composition of titanium), Group 5 elements (such as vanadium, niobium and tantalum) and Group 6 elements (such as chromium, molybdenum and tungsten), other elements are well within the broad scope of the present invention. It should be noted that the above classifications of elements are compatible with the new International Union of Pure and Applied Chemistry notation indicated in the periodic table. Additionally, while the second adhesive 485 generally contains metals such as gold, silver, platinum, palladium and copper, other materials susceptible to plating a ferromagnetic material are well within the broad scope of the present invention. Again, while the ferromagnetic core 490 may be composed of an alloy [such as the permalloy™ or a cobalt-iron composition), other ferromagnetic materials (e.g., an amorphous nickel phosphide) are well within the broad scope of the present invention.

As previously mentioned, it is desirable to manufacture micromagnetic devices as integrated circuits. Employing alloys in the ferromagnetic core 490 is attractive because of the relatively low magnetostriction constants thereby reducing the stress associated with the deposition processes. If relatively high stresses are associated with the deposition process, the magnetic properties of the PMIC 40 may be degraded and the thin films may lack the requisite adhesive properties necessary to facilitate the deposition of the PMIC 400. Obviously, a metallic adhesive should be provided that counteracts the potential built-up stress in the films.

Several attempts have been undertaken to uncover a metallic adhesive that provides a secure interface to a ferromagnetic material and an insulator. For instance, when a metal such as sliver is exclusively used as the metallic adhesive, the ferromagnetic material/silver interface is stronger than the insulator/silver interface. As a result, the ferromagnetic material and silver films may be peeled away from the substrate at a specified testing peel force (using a standard adhesion evaluation technique for less than 1 kG/cm$^2$). Conversely, when chromium is exclusively used as the metallic adhesive, the insulator/chromium interface is stronger than the ferromagnetic material/chromium interface. As a result, the ferromagnetic material and silver films may be peeled away from the substrate at a specified testing peel force (using a standard adhesion evaluation technique for less than 1 kG/cm$^2$). Additionally, the chromium does not provide an adequate seed layer for plating the ferromagnetic material. The present invention, therefore, introduces a metallic adhesive that provides an adequate bond between the ferromagnetic core 490 and the insulators 430, 450, 470 coupled to the substrate 410 to facilitate the fabrication of the PMIC 400.

Figure 5:
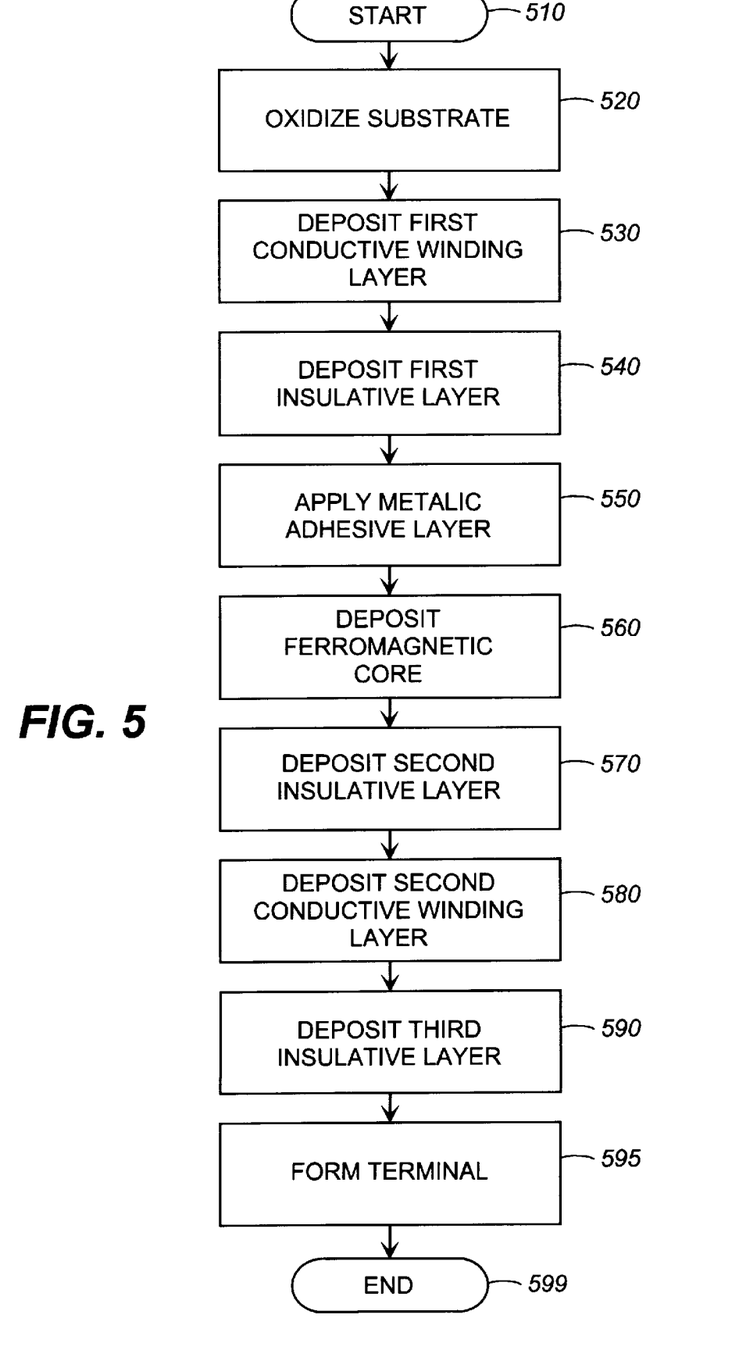
FIG. 5 illustrates a flow diagram of an embodiment of a method of manufacturing the power micromagnetic integrated circuit ("PMIC") of FIG. 4.

Turning now to FIG. 5, illustrated is a flow diagram of an embodiment of a method of manufacturing the PMIC of FIG. 4. The method of manufacturing the PMIC is analogous to conventional silicon-on-silicon multi-chip-module processes [see *Silicon-on-Silicon MCMs with Integrated Passive Components,* by R. C. Frye, et al., Proc. 1992 IEEE Multi-Chip Module Conference, 155, Santa Cruz, Calif. (1992), which is herein incorporated by reference] with the following variations. Generally, a photolithographic process with photoresist is used to define the geometrical features of the PMIC based upon a 20 $\mu$m design rule. While the rule is relatively coarse, it is adequate for fabricating devices such as the PMIC since the major dimensions are multiples of the 20 μm rule. The photolithographic process generally includes the steps of exposing and developing the photoresist and etching away and stripping the unwanted portions of the material that the process is being applied to away from the circuit. Those skilled in the art should be familiar with conventional photolithographic processes.

The PMIC employs a toroidal structure that includes multiple layers. The method begins at a start step 510. A silicon substrate is oxidized with a passivation layer an oxidize substrate step 520. The passivation layer is generally created using conventional thermal growing techniques or chemical vapor deposition techniques. Of course, the substrate may be blank or be composed of a pre-fabricated wafer with underlying circuitry and final passivation. The first conductive winding layer is, then, blanket deposited on the substrate during a deposit first conductive winding layer 530. The first conductive winding layer may be composed of aluminum that is sputter deposited (for instance, at 5 mtorr Argon pressure and room temperature) on the passivation layer having a thicknesses of about 2–10 μm. For thicker conductor traces (to achieve lower resistance) electroplated copper may be used to obtain thicknesses up to about 25 μm. The first conductive winding layer is then patterned to the desired configuration (including the desired contact regions for the PMIC) using a conventional photolithographic process. Of course, another contact region may be formed in the first conductive winding layer to facilitate electrical connectivity to other circuits coupled to the substrate. The first insulative layer is spin coated on the passivation layer and the first conductive winding layer during a deposit first insulative layer step 540. The first insulative layer is cured (at about 350° C. for approximately 12 hours) and after shrinkage an insulative layer of about 3–5 μm thick is produced. The spin coating techniques, generally, provide higher voltage isolation between the primary and secondary windings; generally, the voltage level breakdown values for isolation vary from 500 volts alternating current ("VAC") to 1500 VAC. The first insulative layer is then patterned using a photolithographic process to form the inner-layer vias therethrough.

The metallic adhesive including the first and second adhesive layers are blanket deposited on the first insulative layer during an apply metallic adhesive layer step 550. The first adhesive layer may be composed of chromium that is sputter deposited (for instance, at 5 mtorr Argon pressure and 250° C.) on the first insulative layer having a thicknesses of about 250 Å. The second adhesive layer may be composed of silver that is sputter deposited (for instance, at 5 mtorr Argon pressure and room temperature) on the first adhesive layer having a thicknesses of about 500 A∘. The metallic adhesive also serves as a seed layer for plating the ferromagnetic core. The ferromagnetic core is deposited (e.g., electroplated in a thicknesses of about 2–12 μm) on the metallic adhesive during a deposit ferromagnetic core step 560. The ferromagnetic core may be plated in a buffered sulfamate bath under a controlled temperature (e.g., 25–35° C.) with a current density of about 30 mA/cm². The metallic adhesive and ferromagnetic core are patterned to the desired configuration using a photolithographic process. With regard to the photolithographic process, the etching solutions should be capable of removing the unwanted metallic adhesive (e.g., chromium-silver composition) without attacking the deposited ferromagnetic film. For instance, a standard commercial cerric ammonium nitrate ("CAN") formulation etch solution etches the silver at the rate of about 50 A∘/sec and the chromium at the rate of 250 A∘/min without substantially affecting the ferromagnetic material. Thus, employing a CAN etch for approximately 60–75 seconds is adequate to pattern the metallic adhesive and ferromagnetic core. Again, the first adhesive layer (e.g., chromium) is preferably deposited in the range of 200–300 (250 nominal) A∘ and the second adhesive layer (e.g., silver) is preferably deposited in the range of 400–600 (500 nominal) A∘ to facilitate a controllable etch process.

Furthermore, to eliminate possible lateral etching and undercutting beneath the ferromagnetic core, the second adhesive layer may be composed of copper. In this case, a potassium iodide and water solution may be applied for about 10 seconds to perform the copper etching process and a potassium ferri-cyanide and potassium hydroxide solution may be applied for about 1–2 seconds to perform the chromium etching process. The potassium ferri-cyanide and potassium hydroxide solution does not substantially affect the copper layer underlying the ferromagnetic core thereby preventing the potential affects of undercutting. Of course, other types of etching processes (such as ion etching) are well within the broad scope of the present invention.

The second insulative layer is spin coated on the ferromagnetic core and the first insulative layer during a deposit second insulative layer step 570. The second insulative layer is then patterned using a photolithographic process to form the inner-layer vias therethrough. The second conductive winding layer is, then, blanket deposited (e.g., sputtered) on the second insulative layer during a deposit the second winding conductive layer step 580. The second conductive winding layer is then patterned to the desired configuration (including the desired contact regions) using a photolithographic process. Next, the third insulative layer is spin coated on the second conductive winding layer and the second insulative layer during a deposit third insulative layer step 590. A terminal is finally formed in the third insulative layer during a form terminal step 599. The terminal is suitable for wire bonding (e.g., aluminum wire bonding) or is finished with a solder-wettable metal (e.g., chromium) for use with solder pastes for flip-chip assembly. The method terminates at an end step 599. A completed wafer may then be packaged as an integrated circuit or bare die mounted as in flip-chip assemblies.

While FIGS. 4 and 5 illustrate an embodiment of a power micromagnetic integrated circuit and method of manufacture (including the photolithographic process) therefor, other power micromagnetic integrated circuits (including variations of the foregoing circuit) and methods of manufacture therefor are well within the broad scope of the present invention.

For a better understanding of power electronics, power magnetic devices and power converter topologies see *Principles of Power Electronics,* by J. Kassakian, M. Schlecht, Addison-Wesley Publishing Company (1991). For a better understanding of integrated circuits and methods of manufacture therefor see *Handbook of Sputter Deposition Technology,* by K. Wasa and S. Hayakawa, Noyes Publications (1992) and *Thin Film Technology,* by R. W. Berry, P. M. Hall and M. T. Harris, Van Nostrand (1968); *Thin Film Processes,* by J. Vossen and W. Kern, Academic (1978); and *Handbook of Thin Film Technology,* by L. Maissel and R. Glang, McGraw Hill (1970). The aforementioned references are herein incorporated by reference.

Although the present invention has been described in detail, those skilled in the art should understand that they can make various changes, substitutions and alterations herein without departing from the spirit and scope of the invention in its broadest form.

What is claimed is:

1. A power processing circuit, comprising:
   an input source of electrical power;
   a switching circuit for receiving said electrical power and producing therefrom switched electrical power; and
   a power micromagnetic integrated circuit, including:
      a substrate having an insulator coupled thereto;
      a ferromagnetic core and a winding to impart a desired magnetic property to said ferromagnetic core; and
      a metallic adhesive that forms a bond between said insulator and said ferromagnetic core to secure said ferromagnetic core to said substrate.

2. The power processing circuit as recited in claim 1 further comprising a rectifier and a filter circuit coupled between said integrated circuit and an output of said power processing circuit.

3. The power processing circuit as recited in claim 1 wherein said metallic adhesive comprises a layer that contains a material selected from the group consisting of:
   zirconium; and
   hafnium.

4. The power processing circuit as recited in claim 1 wherein said metallic adhesive comprises a layer that contains a material selected from the group consisting of:
   vanadium;
   niobium; and
   tantalum.

5. The power processing circuit as recited in claim 1 wherein said metallic adhesive comprises a layer that contains a material selected from the group consisting of:
   chromium;
   molybdenum; and
   tungsten.

6. The power processing circuit as recited in claim 1 wherein said metallic adhesive comprises a layer that contains a material selected from the group consisting of:
   gold;
   silver;
   platinum;
   palladium; and
   copper.

7. The power processing circuit as recited in claim 1 wherein said ferromagnetic core contains an alloy material.

8. The power processing circuit as recited in claim 1 wherein said insulator includes an organic polymer.

9. A power processing circuit, comprising:
   an input source of electrical power;
   a switching circuit for receiving said electrical power and producing therefrom switched electrical power; and
   a power micromagnetic integrated circuit, including:
      a substrate,
      a first conductive winding layer formed over said substrate;
      a first insulative layer formed over said first conductive winding layer;
      a metallic adhesive formed over said first insulative layer; and
      a ferromagnetic core formed over said metallic adhesive, said metallic adhesive forming a bond between said first insulative layer and said ferromagnetic core to secure said ferromagnetic core to said substrate.

10. The power processing circuit as recited in claim 9 further comprising a passivation layer interposed between said substrate and said first conductive winding layer.

11. The power processing circuit as recited in claim 9 wherein said power micromagnetic integrated circuit further comprises a second insulative layer formed over said ferromagnetic core.

12. The power processing circuit as recited in claim 11 wherein said power micromagnetic integrated circuit further comprises a second conductive winding layer formed over said second insulative layer.

13. The power processing circuit as recited in claim 12 wherein said power micromagnetic integrated circuit further comprises a third insulative layer formed over said second conductive winding layer.

14. The power processing circuit as recited in claim 13 wherein said power micromagnetic integrated circuit further comprises at least one terminal formed in said third insulative layer.

15. The power processing circuit as recited in claim 9 wherein said metallic adhesive comprises a layer that contains a material selected from the group consisting of:
   zirconium; and
   hafnium.

16. The power processing circuit as recited in claim 9 wherein said metallic adhesive comprises a layer that contains a material selected from the group consisting of:
   vanadium;
   niobium; and
   tantalum.

17. The power processing circuit as recited in claim 9 wherein said metallic adhesive comprises a layer that contains a material selected from the group consisting of:
   chromium;
   molybdenum; and
   tungsten.

18. The power processing circuit as recited in claim 9 wherein said metallic adhesive comprises a layer that contains a material selected from the group consisting of:
   gold;
   silver;
   platinum;
   palladium; and
   copper.

19. The power processing circuit as recited in claim 9 wherein said ferromagnetic core contains an alloy material.

20. The power processing circuit as recited in claim 9 wherein said first insulative layer includes an organic polymer.

* * * * *